United States Patent [19]
Saito et al.

[11] Patent Number: 5,685,919
[45] Date of Patent: Nov. 11, 1997

[54] METHOD AND DEVICE FOR IMPROVED PHOTOELECTRIC CONVERSION

[75] Inventors: Kazuhiro Saito; Hiroshi Yokoyama, both of Tsukuba; Takashi Wakamatsu, Iwaki, all of Japan

[73] Assignee: Agency of Industrial Science & Technology, Tokyo, Japan

[21] Appl. No.: 614,701

[22] Filed: Mar. 13, 1996

[30] Foreign Application Priority Data

Mar. 27, 1995  [JP]  Japan ......................... 7-67454

[51] Int. Cl.⁶ .................... H01L 31/06; H01L 31/07; H01L 31/0232
[52] U.S. Cl. .................. 136/259; 136/255; 136/263; 257/40; 257/432; 257/449; 257/451
[58] Field of Search ..................... 136/255, 259, 136/263; 257/40, 432, 449, 451

[56] References Cited

U.S. PATENT DOCUMENTS

| | | | |
|---|---|---|---|
| 4,127,738 | 11/1978 | Ghosh et al. | 136/255 |
| 4,482,778 | 11/1984 | Anderson | 136/246 |
| 4,482,779 | 11/1984 | Anderson | 136/255 |
| 4,565,422 | 1/1986 | Seymour et al. | 385/36 |
| 5,240,510 | 8/1993 | Goldade et al. | 136/259 |

OTHER PUBLICATIONS

F.R. Fan et al, *J. Chem. Phys.*, vol. 69(7), Oct. 1978, pp. 3334–3340.

*Primary Examiner*—Aaron Weisstuch
*Attorney, Agent, or Firm*—Sterne, Kessler, Goldstein & Fox P.L.L.C.

[57] ABSTRACT

Efficiency of a photoelectric conversion device is increased by inducing a surface plasmon also on a metallic electrode located on the side of the device where light is incident. Incident He-Ne laser light is refracted by a semicylindrical lens and is incident on a magnesium fluoride layer and an Al electrode. The surface plasmon is absorbed by a copper phthalocyanine layer to give a photoelectric current between the Al electrode and an Ag electrode.

19 Claims, 2 Drawing Sheets

METHOD AND DEVICE FOR IMPROVED PHOTOELECTRIC CONVERSION

BACKGROUND OF THE INVENTION

1. Field of the Invention

The present invention relates to a method of and a device for converting light into electricity. More specifically, it relates to a method of and a device for photoelectric conversion that function to improve conversion efficiency by use of a surface plasmon.

2. Description of the Related Art

With a device for photoelectric conversion, the conversion efficiency of the device itself is determined by the materials of the device and its structure. In an attempt to improve the efficiency of optical utilization even slightly, measures, such as the formation of an optical waveguide or an optical scattering structure in the device, have been taken. Alternatively, a substantial improvement in the conversion efficiency has been attempted by laminating a plurality of layers of the device.

In a device for photoelectric conversion of a structure having a thin light absorbing layer sandwiched between two thin metallic electrodes, assume that a prism is intimately contacted with an electrode on the side where light is incident (a primary electrode). Thus, incident light having passed through the prism takes a suitable angle of incidence relative to the electrode. In this case, a surface plasmon is induced on an electrode on the side opposite to the side of light incidence (a secondary electrode), whereby a greater photoelectric current than in the case of ordinary light incidence occurs. This means that the conversion efficiency of a device for photoelectric conversion can be raised by utilizing a surface plasmon localized on a metallic surface and different in nature from ordinary light.

With a device for photoelectric conversion of such a structure, however, induction of the surface plasmon requires the passage of light through all of the primary electrode, the light absorbing layer, and the secondary electrode. Thus, the light is attenuated midway, failing to achieve high efficiency. With a device for photoelectric conversion with a thick light absorbing layer which also serves as the secondary electrode, on the other hand, it is impossible to induce surface plasmons.

SUMMARY OF THE INVENTION

Under these circumstances, this invention has been accomplished to induce surface plasmons on a metallic electrode on the side where light is incident. Its object is to provide a method of and a device for photoelectric conversion with a high conversion efficiency.

That is, in the first aspect of the present invention, a method of photoelectric conversion comprises the steps of:

causing incident light to be incident on an optical transmission layer at a desired angle through an optical path changing layer, the optical transmission layer having a thickness being about a half of the wavelength of the incident light and having a lower refractive index than that of the optical path changing layer, to induce a surface plasmon at the interface between the optical transmission layer and a metallic electrode in intimate contact with the optical transmission layer, and causing the surface plasmon to be incident on a light absorbing layer to obtain a photoelectric current.

In the above method, the optical path changing layer may be a transparent material layer having a higher refractive index than that of the optical transmission layer. Preferably, the optical path changing layer is a semicylindrical lens of BK glass.

The optical transmission layer may be a transparent material layer having a lower refractive index than that of the optical path changing layer. Preferably, the optical transmission layer is a magnesium fluoride layer.

The metallic electrode may be an Al layer.

The light absorbing layer may be a semiconductor layer which absorbs light. Preferably, the light absorbing layer is a copper phthalocyanine layer.

In a second aspect of the present invention, a device for photoelectric conversion comprises:

two thin metallic electrodes respectively located on the side where light is incident, and on the side opposite to the side of light incidence;

a light absorbing layer sandwiched between the two thin metallic electrodes; and an optical transmission layer and an optical path changing layer formed in this order on the metallic electrode located on the side of light incidence, with the adjacent members being in intimate contact with each other; wherein the optical path changing layer has the function to refract incident light and cause it to be incident on the optical transmission layer at a desired angle, the refractive index of the optical transmission layer is smaller than the refractive index of the optical path changing layer, and the thickness of the optical transmission layer is about a half of the wavelength of the incident light.

In the above device, the optical path changing layer may be a transparent material layer having a higher refractive index than that of the optical transmission layer. Preferably, the optical path changing layer is a semicylindrical lens of BK glass.

The optical transmission layer may be a transparent material layer having a lower refractive index than that of the optical path changing layer. Preferably, the optical transmission layer is a magnesium fluoride layer.

The metallic electrode located on the side of light incidence may be an Al layer. The metallic electrode located on the side opposite to the side of light incidence may be an Ag layer.

The light absorbing layer may be a semiconductor layer which absorbs light. Preferably, the light absorbing layer is a copper phthalocyanine layer.

According to the method of photoelectric conversion of the present invention, incident light is caused to be incident on the optical transmission layer at a desired angle through the optical path changing layer, the optical transmission layer having a thickness being about a half of the wavelength of the incident light and having a lower refractive index than that of the optical path changing layer, whereby a surface plasmon is induced at the interface between the optical transmission layer and the metallic electrode in intimate contact with the optical transmission layer. The surface plasmons is caused to be incident on the light absorbing layer to obtain a photoelectric current. Since induction of surface plasmons is thus possible on the light incidence side as well, the efficiency of photoelectric conversion can be raised markedly.

According to the device for photoelectric conversion of the present invention, the light absorbing layer is sandwiched between the two thin metallic electrodes located on the side of light incidence and on the side opposite to the side of light incidence, respectively; and the optical transmission layer and the optical path changing layer are formed in this order on the metallic electrode located on the side of light incidence, with the adjacent members being in intimate contact with each other. The optical path changing layer functions to refract incident light and cause it to be incident on the optical transmission layer at a desired angle, the refractive index of the optical transmission layer is smaller than the refractive index of the optical path changing layer, and the thickness of the optical transmission layer is about a half of the wavelength of the incident light. As noted above, incident light is refracted in the optical path changing layer and caused to be incident on the optical transmission layer, thereby inducing surface plasmons on the light incidence side as well, so that the efficiency of photoelectric conversion can be raised markedly.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

Figure 1:
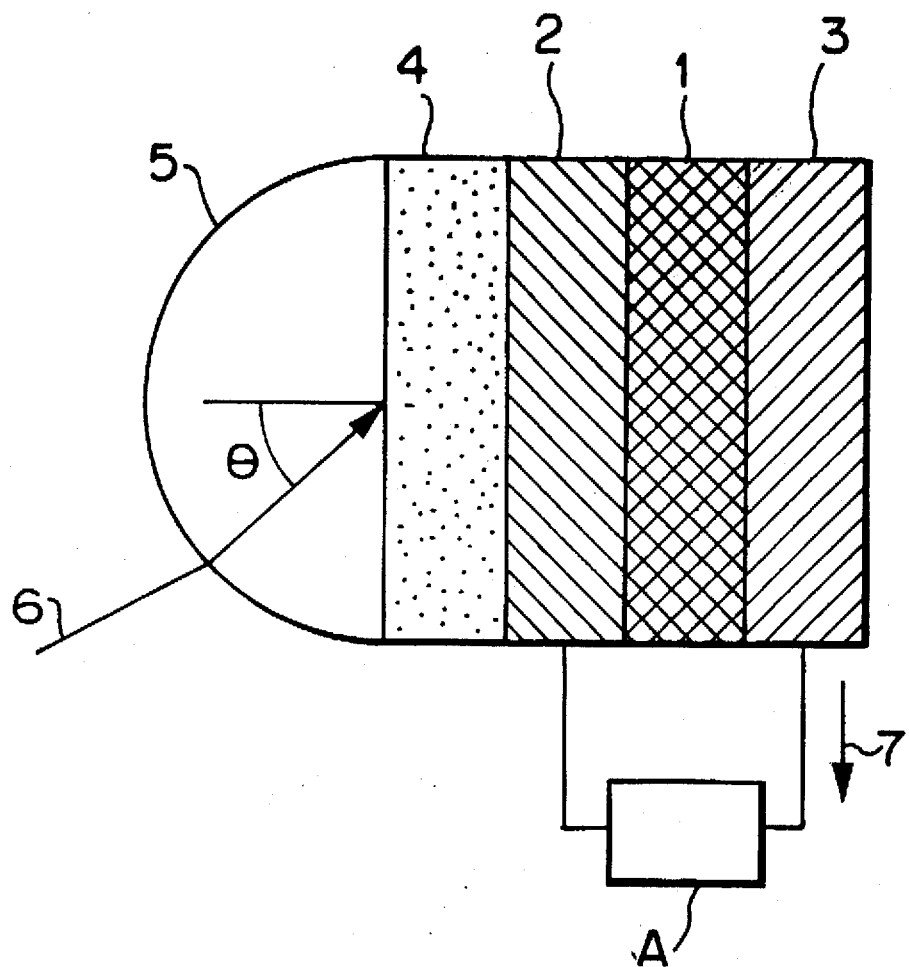
FIG. 1 is a sectional view showing the structure of an embodiment of the present invention.

The inventors have found that by introducing an optical transmission layer, which has a smaller refractive index than that of a prism and a thickness about a half of the wavelength of light to be used, into a gap between the prism and metallic thin films, surface plasmons can be induced at the interface between the optical transmission layer and the metallic electrode (thin film) located on the side of light incidence. Based on this finding, the present invention has been accomplished.

That is, one aspect of the invention, the method for photoelectric conversion, comprises causing incident light to be incident on an optical transmission layer at a desired angle through an optical path changing layer, the optical transmission layer having a thickness being about a half of the wavelength of the incident light and having a lower refractive index than that of the optical path changing layer, to induce a surface plasmons at the interface between the optical transmission layer and a metallic electrode in intimate contact with the optical transmission layer; and causing the surface plasmon to be incident on a light absorbing layer to obtain a photoelectric current.

Another aspect of the invention, the device for photoelectric conversion, comprises two thin metallic electrodes repectively located on the side where light is incident, and on the side opposite to the side of light incidence; a light absorbing layer sandwiched between the two thin metallic electrodes; and an optical transmission layer and an optical path changing layer formed in this order on the metallic electrode located on the side of light incidence, with the adjacent members being in intimate contact with each other; wherein the optical path changing layer has the function to refract incident light and cause it to be incident on the optical transmission layer at a desired angle, the refractive index of the optical transmission layer is smaller than the refractive index of the optical path changing layer, and the thickness of the optical transmission layer is about a half of the wavelength of the incident light.

In the aspect of the invention as the device for photoelectric conversion, moreover, the optical path changing layer is a semicylindrical lens of BK glass, the optical transmission layer is a magnesium fluoride layer, the metallic electrode located on the side of light incidence is an Al layer, the light absorbing layer is a copper phthalocyanine layer, and the metallic electrode located on the side opposite to the side of light incidence is an Ag layer.

In the aspect of the invention as the method of photoelectric conversion, when incident light is incident on the optical transmission layer, having a low refractive index, at a desired angle through the optical path changing layer having a high refractive index, a surface plasmon is induced at the interface between the optical transmission layer and the metallic electrode located on the side of light incidence. The surface plasmon is then incident on the light absorbing layer to obtain a photoelectric current.

In the aspect of the invention as the device for photoelectric conversion, moreover, incident light is refracted in the optical path changing layer having a high refractive index, and is then incident on the optical transmission layer, having a low refractive index, at a desired angle. As a result, a surface plasmon is induced at the interface between the optical transmission layer and the metallic electrode in intimate contact therewith. The surface plasmon is then incident on the light absorbing layer to obtain a photoelectric current.

EXAMPLES

FIG. 1 is a sectional view of an embodiment of a device for photoelectric conversion according to the present invention. The numeral 1 denotes a copper phthalocyanine layer with a thickness of, say, about 30 nm as a light absorbing layer, 2 an Al layer with a thickness of, say, about 20 nm as a primary electrode (incidence side), 3 an Ag layer with a thickness of, say, about 50 nm as a secondary electrode, 4 a magnesium fluoride layer with a thickness of, say, about 300 nm as a light transmission layer, and 5 a semicylindrical lens of BK7Glass with a radius of, say, 15 mm as a light path changing layer. The numeral 6 signifies incident light, 7 a photoelectric current, and A an ammeter.

The semicylindrical lens 5 functions as an optical path changing layer by refracting incident light, thus changing the angle, θ, of light incident on the Al layer 2 being the primary electrode.

BK7 glass has a refractive index of about 1.52, and magnesium fluoride has a refractive index of about 1.38. Thus, the magnesium fluoride layer 4 plays the role of an optical transmission layer having a smaller refractive index than that of the semicylindrical lens 5 as the optical path changing layer and having a thickness being about a halfwave length.

The copper phthalocyanine layer 1 functions as a light absorbing layer, and forms a Schottky barrier together with the Al layer 2, while forming an ohmic contact with the Ag layer 3. Thus, the three-layer portion composed of the Al, copper phthalocyanine, and Ag layers constitutes a Schottky junction type photoelectric conversion device. The function of photoelectric conversion appears mainly at the interface between the Al layer 2 and the copper phthalocyanine layer 1.

Figure 2:
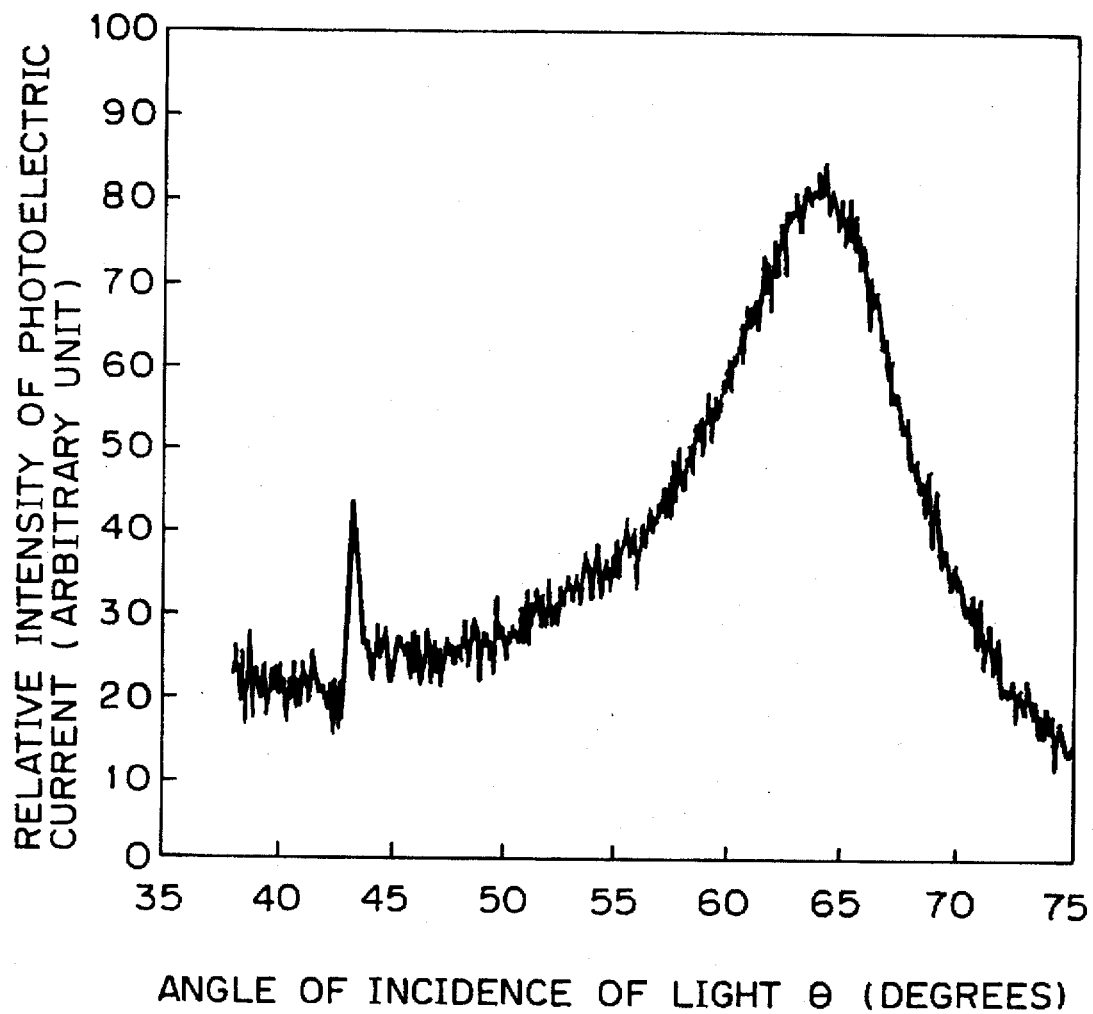
FIG. 2 is a view showing the light incidence angle dependence characteristic of photoelectric current in the embodiment illustrated in FIG. 1.

FIG. 2 shows changes in the relative intensity of a photoelectric current, as measured by the ammeter A, occurring when He-Ne laser light, L, with a wavelength of 632.8 nm and a beam diameter of 1 mm is incident on the device for photoelectric conversion at a varying angle of incidence, θ. The value obtained when θ is about 40° corresponds to the value of the photoelectric current of the ordinary device for photoelectric conversion in the absence of contribution from surface plasmon. A sharp peak in the photoelectric current appearing at θ of about 43° is an effect produced by the induction of a surface plasmons on the Ag layer 3 (the secondary electrode), as has already been known. A great peak in the photoelectric current appearing at θ of about 63°, on the other hand, is an increased photoelectric current ascribed to the induction of surface plasmons, on the Al layer 2 (the primary electrode) in accordance with the present invention.

During the actual use of this device for photoelectric conversion, a broad flux of light, rather than a finely constricted laser beam, is projected onto and converged by the semicylindrical lens 5. Thus, beams of light with different angles of incidence, θ, are incident simultaneously, so that the area of the zone surrounded by the characteristic curve and the numerical axes in FIG. 2 take effect on photoelectric conversion. In FIG. 2, the conventional induction characteristic of surface plasmons on the Ag layer 3 (secondary electrode) is very sharp, whereas the induction characteristic on the Al layer 2 (primary electrode) is considerably gentle. This means that the induction conditions for surface plasmons according to the present invention are less severe than those according to the prior art, thus enabling surface plasmons to be induced with more light.

Even when light is projected at the angle of incidence, θ, without the induction of surface plasmons, the semicylindrical lens 5 (the optical path changing layer) and the magnesium fluoride layer 4 (the optical transmission layer) do not cease to act as ordinary elements for photoelectric conversion. Thus, the present invention does not decrease, but improves, the efficiency of conversion.

As noted above, the present invention is highly effective for improving the efficiency of photoelectric conversion in a device for photoelectric conversion.

In the above-described embodiment, the semicylindrical lens 5 of BK7 glass has been quoted as the optical path changing layer. Besides glass, any transparent materials having a higher refractive index than that of the optical transmission layer, such as sapphire and plastics, may be used. In addition to the cylindrical shape, any shape would do, as long as it can change the optical path by refracting light at the interface between the air and the optical path changing layer.

The magnesium fluoride layer 4 has been described as the optical transmission layer, which basically has to be composed of a transparent material having a lower refractive index than that of the optical path changing layer. If the layer is a solid thin film, its materials are restricted to magnesium fluoride and calcium fluoride.

The copper phthalocyanine layer 1 has been described as the light absorbing layer, which may be formed of any semiconductor, whether organic or inorganic, capable of light absorption. Organic examples are merocyanine, squarylium, and porphyrin. Inorganic examples are silicon and germanium.

The Al electrode 2 and the Ag electrode 3 have been shown as the metallic electrodes. Besides them, a combination of Au and Cu may be used.

The present invention has been described in detail with respect to various embodiments, and it will now be apparent from the foregoing to those skilled in the art that changes and modifications may be made without departing from the invention in its broader aspects, and it is my intention, therefore, in the appended claims to cover all such changes and modifications as fall within the true spirit of the invention.

What is claimed is:

1. A method of photoelectric conversion comprising the steps:

causing light to be incident on an optical transmission layer at a desired angle through an optical path changing layer, the optical transmission layer having a thickness being about a half of the wavelength of the incident light and having a lower refractive index than that of the optical path changing layer, to induce a surface plasmons at the interface between the optical transmission layer and a metallic electrode in intimate contact with the optical transmission layer; and causing the surface plasmons to be incident on a light absorbing layer to obtain a photoelectric current.

2. The method as claimed in claim 1, wherein the optical path changing layer is a transparent material layer having a higher refractive index than that of the optical transmission layer.

3. The method as claimed in claim 2, wherein the optical path changing layer is a semicylindrical lens of BK glass.

4. The method as claimed in claim 1, wherein the optical transmission layer is a transparent material layer having a lower refractive index than that of the optical path changing layer.

5. The method as claimed in claim 4, wherein the optical transmission layer is a magnesium fluoride layer.

6. The method as claimed in claim 1, wherein the metallic electrode is an Al layer.

7. The method as claimed in claim 1, wherein the light absorbing layer is a semiconductor layer.

8. The method as claimed in claim 7, wherein the light absorbing layer is a copper phthalocyanine layer.

9. A device for photoelectric conversion, comprising two thin metallic electrodes respectively located on the side where light is incident, and on the side opposite to the side of light incidence;

a light absorbing layer sandwiched between the two thin metallic electrodes; and an optical transmission layer and an optical path changing layer formed in this order on the metallic electrode located on the side of light incidence, with the adjacent members being in intimate contact with each other; wherein the optical path changing layer has the function to refract incident light and cause it to be incident on the optical transmission layer at a desired angle, the refractive index of the optical transmission layer is smaller than the refractive index of the optical path changing layer, and the thickness of the optical transmission layer is about a half of the wavelength of the incident light.

10. The device as claimed in claim 9, wherein the optical path changing layer is a transparent material layer having a higher refractive index than that of the optical transmission layer.

11. The device as claimed in claim 10, wherein the optical path changing layer is a semicylindrical lens of BK glass.

12. The device as claimed in claim 9, wherein the optical transmission layer is a transparent material layer having a lower refractive index than that of the optical path changing layer.

13. The device as claimed in claim 12, wherein the optical transmission layer is a magnesium fluoride layer.

14. The device as claimed in claim 9, wherein the metallic electrode located on the side of light incidence is an Al layer.

15. The device as claimed in claim 9, wherein the metallic electrode located on the side opposite to the side of light incidence is an Ag layer.

16. The device as claimed in claim 9, wherein the light absorbing layer is a semiconductor layer which absorbs light.

17. The device as claimed in claim 16, wherein the light absorbing layer is a copper phthalocyanine layer.

18. The device as claimed in claim 9, wherein a desired angle of incident light comprises the range of about sixty degrees to about sixty-seven degrees.

19. The device as claimed in claim 18, wherein the preferred angle of incidence is about sixty-three degrees.

* * * * *